United States Patent
Kim et al.

(10) Patent No.: US 7,301,360 B2
(45) Date of Patent: *Nov. 27, 2007

(54) METHOD AND APPARATUS FOR INSPECTING FLAT PANEL DISPLAY

(75) Inventors: Jong Dam Kim, Kyounggi-do (KR); Hyun Kyu Lee, Seoul (KR); Yong Jin Cho, Seoul (KR); See Hwa Jeong, Kyounggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/669,348

(22) Filed: Sep. 25, 2003

(65) Prior Publication Data

US 2004/0222814 A1   Nov. 11, 2004

(30) Foreign Application Priority Data

May 6, 2003   (KR) ................ 10-2003-0028643

(51) Int. Cl.
    *G01R 31/00* (2006.01)
(52) U.S. Cl. ...................................... 324/770
(58) Field of Classification Search ........... 324/770, 324/529, 752, 537, 753, 754, 158.1, 750, 324/765; 349/40, 54, 192; 438/14–18; 345/87, 345/90, 904–905
    See application file for complete search history.

(56) References Cited

U.S. PATENT DOCUMENTS 5,073,754 A * 12/1991 Henley .................. 324/529
6,545,500 B1 * 4/2003 Field .................... 324/770
6,566,902 B2 * 5/2003 Kwon et al. ............ 324/770
2002/0075419 A1   6/2002 Kwon et al.

FOREIGN PATENT DOCUMENTS

| JP | 56-154678 A | 11/1981 |
|---|---|---|
| JP | 63-285476 A | 11/1988 |
| JP | 6-26987 A | 2/1994 |
| JP | 08-015360 A | 1/1996 |
| JP | 9-270544 A | 10/1997 |
| JP | 10-222817 A | 8/1998 |
| JP | 11-259820 A | 9/1999 |
| JP | 2001-296507 A | 10/2001 |
| JP | 2002-358609 A | 12/2002 |

* cited by examiner

*Primary Examiner*—Ha Tran Nguyen
*Assistant Examiner*—Tung X. Nguyen
(74) *Attorney, Agent, or Firm*—Birch, Stewart, Kolasch & Birch, LLP

(57) ABSTRACT

A novel method and apparatus inspects liquid crystal display. The method and apparatus for inspecting the flat display device scans at least one signal wire by using a magnetic sensor and detects a resistance change of the magnetic sensor to perceive a short in the signal wire. Pixels can be tested using an array of magnetic sensors configured such that each sensor in the array is smaller than the pixel.

22 Claims, 18 Drawing Sheets

METHOD AND APPARATUS FOR INSPECTING FLAT PANEL DISPLAY

This application claims priority under 35 U.S.C. §119 of Korean Application No. P2003-28643, filed May 6, 2003, the entire contents of which are hereby incorporated by reference.

BACKGROUND OF THE INVENTION

1. Field of the Invention

The invention pertains to a method and an apparatus for inspecting for bad wiring and pixels in a flat display device by using a magnetic sensor.

2. Description of the Related Art

The importance of a display apparatus as a visual information transfer medium has recently enlarged. Widely used conventional cathode ray tubes have undesirable weight and large volume. There has therefore been developed various types of flat display apparatuses capable of overcoming the disadvantages of cathode ray tubes.

These flat display devices include a liquid crystal display (LCD), a field emission display (FED), a plasma display panel (PDP) and an electroluminescence display (EL). Most of these displays are available in the marketplace.

The liquid crystal display readily adapts to miniaturization and has enhanced productivity. Thus, LCDs are rapidly replacing the cathode ray tube in many applications.

Specifically, an active matrix type liquid crystal display apparatus that drives a liquid crystal cell by using a thin film transistor (hereinafter referred to as "TFT") has an advantage of excellent picture quality combined with low power consumption. This technology has rapidly developed to large volume production of high definition displays due to recent research and the application of productivity technology.

The process for fabricating an active matrix type display device is divided into substrate cleaning, substrate patterning, alignment forming/rubbing, substrate assembling/liquid crystal material injecting, mounting, inspecting and repairing.

Impurities on a substrate surface of the liquid crystal display device are removed by a detergent during the substrate cleaning process.

The substrate patterning process includes patterning of an upper substrate, i.e., a color filter substrate, and patterning of a lower substrate, i.e., a TFT array substrate. There are formed a color filter, a common electrode and a black matrix on the upper substrate. Signal wires such as a data line and a gate line are formed on the lower substrate, and the TFT is formed at an intersection of the data line and the gate line. A pixel electrode is formed in a pixel region between the gate line and the data line connected to a source electrode of the TFT.

An alignment film is applied to each of the upper substrate and the lower substrate in the alignment film forming/rubbing process, and the alignment film is rubbed by a rubbing material.

In the substrate assembling/the liquid crystal injection process, both of the upper substrate and the lower substrate are bonded together by a sealant, and the liquid crystal material and a spacer are injected through a liquid crystal injection hole. The liquid crystal injection hole is then sealed.

The mounting process of the liquid crystal panel uses a tape carrier package (hereinafter referred to as "TCP") having integrated circuits mounted thereon, such as a gate drive integrated circuit and a data drive integrated circuit is connected to a pad part on the substrate. Such drive integrated circuits maybe directly mounted on the substrate by using a chip on glass (herein after referred to as "COG") method other than TAB (Tape Automated Bonding) using the TCP described above.

The inspection process includes a first electrical inspection being performed after forming a variety of signal wires and the pixel electrode, and an electrical inspection and a visual inspection being performed after the substrate assembly/liquid crystal injection process. Specifically, the electrical inspection of the signal wires and the pixel electrode of the lower substrate, followed by substrate assembly, may reduce the defect ratio and the amount of waste matter. A bad substrate may also be reparable at an early stage, and thus its importance gradually increases.

The repairing process performs a restoration of a repairable substrate discovered by the inspecting process. However, in the inspecting process, defective substrates that are beyond repair are discarded.

The electrical inspection being performed before substrate assembling frequently employs a method using an apparatus shown in FIG. 1.

Referring to FIG. 1, the electrical inspection process is performed as follows: a separate modulator 10 has a designated gap over a test substrate 11. Applying a test voltage (Vtest) to the modulator, while maintaining the gap, and detecting light reflected from the modulator 10 determines any electrical defects of the signal wires 17 and 18.

In the modulator 10, a polymer-dispersed liquid crystal (hereinafter referred to as "PDLC") is located between an upper transparent substrate 12, having a common electrode 13 formed thereon, and a lower transparent substrate 15. In the modulator 10, a reflection sheet 16 is set up toward a rear surface of the lower transparent substrate 15. The modulator 10 has an air nozzle and a vacuum nozzle for an auto-gapping, which maintains the designated interval from the substrate 11 to be tested.

Above the modulator, a lens 21 light-gathers the light from a light source (not shown) into the modulator 10, and the lens 21 additionally transmits the light 22 reflected from the modulator 10.

The test substrate 11 includes a lower substrate having the TFT 19 thereon. Signal wires 17 and 18 and the pixel electrode 20 are formed in an active matrix type liquid crystal display device.

The electrical inspection begins by loading the test substrate 11 below the modulator 10, and the modulator descends while performing the auto-gapping. While maintaining the gap between the modulator 10 and the test substrate 11 at a predetermined effective gap, the light is radiates from the light source (not shown), and the light focuses on the modulator 10 by the light-gathering lens and simultaneously a test voltage (Vtest) is applied to the common electrode 13. Test data supplied from a driving circuit is applied to the data wires 17, and a test scan signal is applied to the gate wires 18. Then, an effective electric field is applied to the PDLC 14 between the common electrode 13 of the modulator 10 and the pixel electrode 20 being tested.

When the electric field is not applied, the PDLC 14 causes the light to scatter. When the effective electric field (E) is applied, the liquid crystal orients according to the direction of the effective electric field (E) and causes the light to transmit. Accordingly, in the electrical inspection process, when the voltage is normally applied to the pixel electrode 20, the corresponding liquid crystal layer of the PDLC 14 causes the light 22 to transmit. When the voltage is not applied to the pixel electrode 20, the liquid crystal layer of the PDLC 14 causes the light to be scattered in that part.

While the light 22 transmitting the liquid crystal layer of the PDLC 14 is reflected by the reflection sheet 16 and then is reverse directed to the light path, the light 22 scattered in the liquid crystal layer of the PDLC 14 is nearly vanishes and is not nearly incident to the reflection sheet 16. The light reflected in the modulator 10 is received to a charge-coupled device (CCD) (not shown) via the lens 21 and then is converted in an electrical signal. Then, the converted signal is transferred to a display (not shown) via a signal processing circuit. A testing inspector monitors an image or data displayed in the display to determine whether defects are present. The test inspector secondarily performs a close inspection of any doubtful signal wires 17 and 18.

The modulator 10 has the advantages of exactness and reliability for inspecting for defects pixel-by-pixel, but these advantages come at a high cost. Further, since the inspection region is narrow as compared to the total area of the substrate 11, the modulator 10 must repeat the inspection process by moving in a designated length in the vertical or the horizontal direction and then temporarily stopping for auto-gapping. Thus, the inspection time is disadvantageously extended. Further, the exactness of the modulator 10 with respect to the highly fine detail of the flat display device is lower than desired.

For example, FIG. 2 shows a portion of the first column and the second row of the pixel electrode PIX (1,2) among the pixel electrodes PIX (1,1) to PIX (2,3) formed in the pixel region between the data wires 32*a*, 32*b* and 32*c*, and the gate wires 31*a* and 31*b* are lost due to bad patterning. When a test scan voltage is applied to the gate wire 31*a* and simultaneously a test data voltage is applied to the data wire 32*b*, since the test data voltage is supplied to the first column and the second row of the pixel electrode PIX (1,2) via the TFT (not shown), an electric field is generated between the pixel electrode PIX (1,2) and the common electrode 13 of the modulator 10 as in normal pixel. As a result, since reflecting light is collected by a charge-coupled device via the modulator 10 in the pixel corresponding to the first column and second row of the pixel electrode PIX (1,2), the pixel is determined to be normal.

SUMMARY OF THE INVENTION

Accordingly, it is an object of the present invention to provide a method and device to inspect for defects in a wire and a pixel of a flat display device by using a magnetic sensor.

In order to achieve these and other objects of the invention, the inspecting method of the flat display device according to one aspect of the present invention includes scanning one or more signal wires by using a magnetic sensor, and detecting a resistance change of the magnetic sensor to perceive a short of the signal wire.

The step of detecting the resistance change of the magnetic sensor includes detecting the resistance of the magnetic sensor depending on the change of current flowing in the magnetic sensor, and determining a short in the signal wire if the resistance of the magnetic sensor is larger than a designated reference value.

The method also entails applying different voltages to the adjacent signal wires.

The step of applying the different voltages to the adjacent signal wires includes applying a first common voltage to odd-numbered signal wires, and applying a second common voltage to even-numbered signal wires.

The magnetic sensor scans the signal wire on pads connected to the other side of the signal wires.

The magnetic sensor includes a hard magnetic layer and a soft magnetic layer, and the magnetization direction of the soft magnetic layer is changed depending on a magnetic field induced by the signal wire.

The step of perceiving a short in the signal wire includes determining the short of the signal wire when a primary magnetization direction of the soft magnetic layer is inverted.

The invention, in part, pertains to a method of inspecting a liquid crystal display having multiple signal wires, which includes scanning, with a magnetic sensor, one or more second signals wires stacked over an insulation layer and at least one of first signal wires, and detecting a resistance change of the magnetic sensor to perceive an interlayer short between the first and the second signal wires.

The step of perceiving an interlayer short between the first and second signal wires includes detecting the resistance of the magnetic sensor depending on a change of a current flowing in the magnetic sensor, and determining a short of the first and second signal wire if the resistance of the magnetic sensor is larger than a designated reference value.

The invention includes applying a first common voltage to one side of the first signal wires, and applying a second common voltage to one side of the second signal wires.

The magnetic sensor scans the second signal wire on the pads connected to the other side of the second signal wire.

The magnetic sensor includes a hard magnetic layer and a soft magnetic layer, and the magnetization direction of the soft magnetic layer is changed by an induced magnetic field from the first and second signal wires.

The step of perceiving an interlayer short between the first and second signal wires includes determining a short of the signal wire when a primary magnetization direction of the soft magnetic layer is inverted.

The invention, in part, pertains to a method of inspecting a liquid crystal display device having a plurality of signal wires, that includes scanning an electrode pattern by using a sensor array including one of more magnetic sensors below a pixel in size, and detecting the resistance change of each of the magnetic sensors to perceive the badness of the electrode pattern.

In the invention, the step of detecting the resistance change of the magnetic sensor includes detecting the resistance of the each of the magnetic sensors with the change of the current flowing to each of the magnetic sensors, and determining the short of a portion of the electrode pattern at the location where the resistance of the magnetic sensor is larger than designated reference value.

Also, the method can also include applying current to the electrode pattern.

In the invention, the magnetic sensor includes a hard magnetic layer and a soft magnetic layer, and the magnetization direction of the soft magnetic layer is changed by an induced magnetic field from the signal wire.

Also, the step of detecting the resistance change of each of the magnetic sensors includes determining that the electrode pattern is lost when the incipient magnetization direction of the soft magnetic layer is returned to the incipient magnetization direction at the location where the electrode pattern is lost after inverting by the induced magnetic field from the electrode pattern where the current flows.

The invention, in part, pertains to an apparatus for inspecting a flat display device having multiple signal wires, which includes magnetic sensor for scanning one or more signal wires; and a detecting circuit for detecting the resistance change of the magnetic sensor to perceive a short of the signal wire.

The magnetic sensor can be one of a giant magneto-resistance sensor, a magneto-resistance sensor, a tunneling magneto-resistance sensor, a fluxgate sensor and an inductive sensor.

Also, the detecting circuit detects the resistance of the magnetic sensor with the change of the current flowing to the magnetic sensor.

The invention can also include a voltage source for supplying different voltages to the adjacent signal wires.

The voltage source can include a first voltage source for supplying a first common voltage to one side of odd-numbered signal wires, and a second voltage source for supplying a second common voltage different from the first common voltage to one side of even-numbered signal wires.

Further, the magnetic sensor can scan the signal wires on the pads connected to the other side of the signal wires.

The invention, in part, pertains to an apparatus for inspecting a liquid crystal display that includes a magnetic sensor for scanning over at least one second signal wire stacked on at least one first signal wire where an insulation layer is located between the first signal and the second signal wires. A detecting circuit detects a resistance change of the magnetic sensor to perceive an interlayer short of the signal wires.

The magnetic sensor can be one of a giant magneto-resistance sensor, a magneto-resistance sensor, a tunneling magneto-resistance sensor, a fluxgate sensor and an inductive sensor.

The detecting circuit detects the resistance of the magnetic sensor with the change of the current flowing to the magnetic sensor.

The apparatus can further include a first voltage source for supplying a first common voltage to one side of the first signal wires, and a second voltage source for supplying a second common voltage different from the first common voltage to one side of the second signal wires.

Also, the magnetic sensor can scan the first and second signal wires on the pads connected to the other side of the first and second signal wires.

The invention, in part, pertains to an apparatus for inspecting a liquid crystal display that includes a magnetic sensor including at least one magnetic sensor below a pixel in size for scanning on an electrode pattern. A detecting circuit detects a resistance change of each of the magnetic sensors to perceive a bad electrode pattern.

The magnetic sensors can be one of a giant magneto-resistance sensor, a magneto-resistance sensor, a tunneling magneto-resistance sensor, a fluxgate sensor and an inductive sensor.

The detecting circuit detects the resistance of each of the magnetic sensors with the change of the current flowing to each of the magnetic sensors.

Also, the invention can further include a voltage source for supplying a current to the electrode pattern.

BRIEF DESCRIPTION OF THE DRAWINGS

The accompanying drawings are included to provide a further understanding of the invention. These and other objects of the invention will be apparent from the following detailed description with reference to the accompanying drawings.

DETAILED DESCRIPTION

Advantages of the invention will become more apparent from the detailed description given herein after. However, it should be understood the detailed description and specific examples, while indicating preferred embodiments of the invention, are given by way of illustration only, since various changes and modifications within the spirit and scope of the invention will become apparent to those skilled in the art from this detailed description.

Hereafter, referring to FIGS. 3 to 20*b*, a preferred embodiment of the present invention will be explained.

A method and apparatus for inspecting a flat display device according to an embodiment of the present invention inspects for bad signal wires and pixel electrodes by using a magnetic sensor such as a GMR(a giant magneto-resistance sensor), a MR(a magneto-resistance sensor), a TMR(a tunneling magneto-resistance sensor), a fluxgate sensor or an inductive sensor. The following description will be made with respect to the GMR sensor of these magnetic sensors. However, the invention is not restricted to the enumerated magnetic sensors, and any appropriate magnetic sensor can be used to practice the invention.

Figure 1:
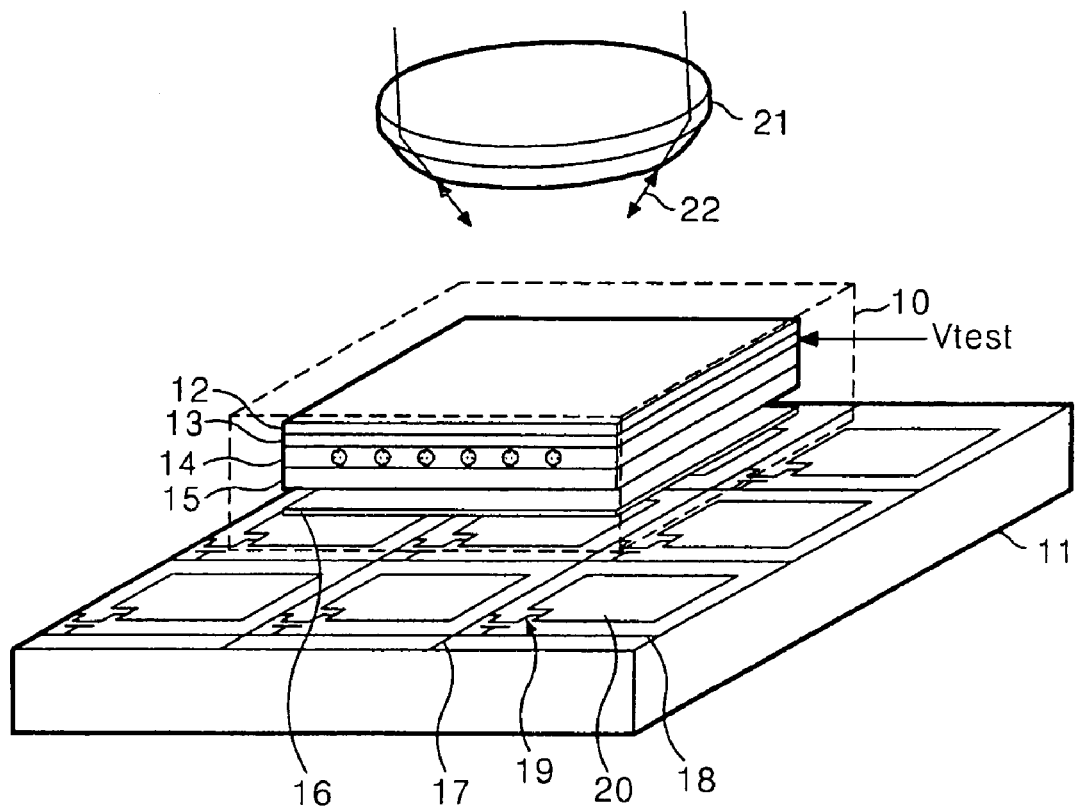
FIG. 1 is a perspective view illustrating a device for electrically inspecting a liquid crystal display of the related art.
Figure 2:
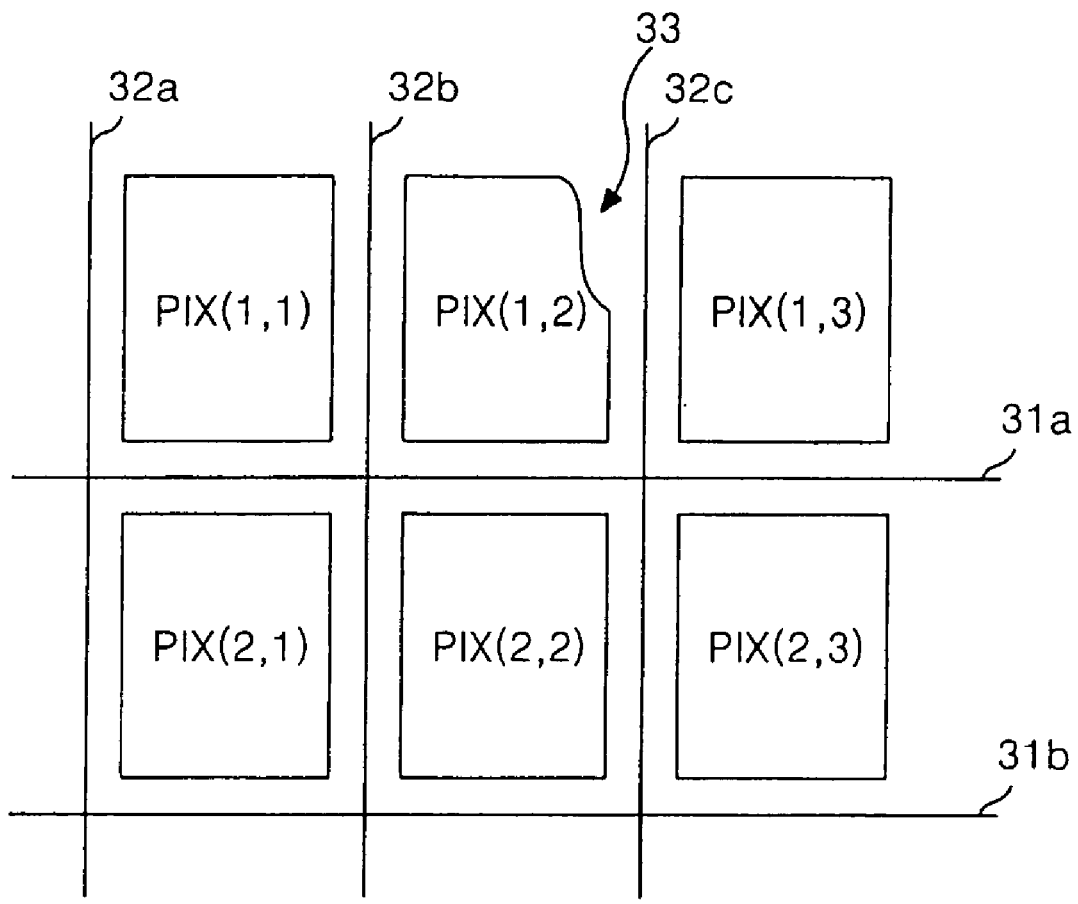
FIG. 2 is a plane view illustrating one example of a bad pattern of a pixel electrode.
Figure 3:
FIG. 3 is a cross sectional view illustrating a giant magneto-resistance sensor (GMR).
Figure 4:
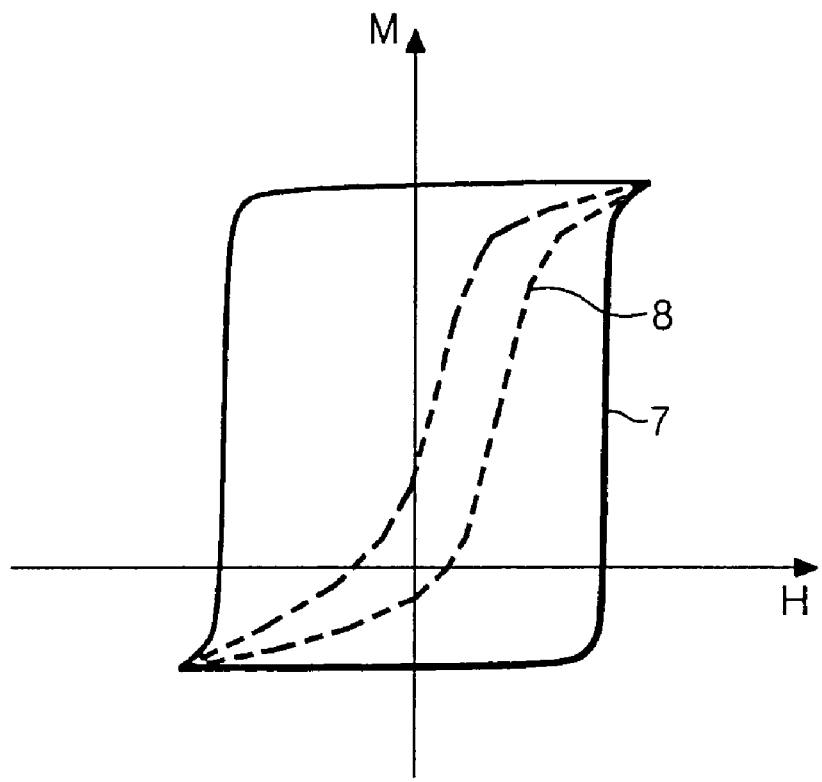
FIG. 4 is a graph illustrating a hysteresis characteristic of a GMR sensor.

FIG. 3 shows the GMR sensor having a fixed layer 2, a hard magnetic layer 3, a non-magnetic layer 4 and a soft magnetic layer 5 stacked over the substrate 1.

The fixed layer 2 serves to fix a magnetization direction or magnetic spin momentum of the hard magnetic layer 3.

The hard magnetic layer 3 is formed from a magnetic material that has a large saturated magnetic field, such as Co. The magnetization characteristic of the hard magnetic layer 3 is inverted when an external magnetic field H and an induced magnetic field M widely vary, as in the hysteresis curve 7 shown in FIG. 4.

The non-magnetic layer 4 is formed from a non-magnetic material such as Cu, and the non-magnetic layer 4 cuts off magnetic interference between the hard magnetic layer 3 and the soft magnetic layer 5. The material of the non-magnetic layer 4 is not restricted to copper, and any suitable non-magnetic material, such as Al, Sn, Au or I, can be used.

The soft magnetic layer 5 is formed from a magnetic material that has a small saturated magnetic field, such as NiFe. The material of the soft magnetic layer 5 is not restricted to NiFe, and any suitable material can be used. The magnetization characteristic of the soft magnetic layer 5 is inverted although there is a little change in the external magnetic field H and the induced magnetic field M, such as in the hysteresis curve 8 shown in FIG. 4.

Figure 5:
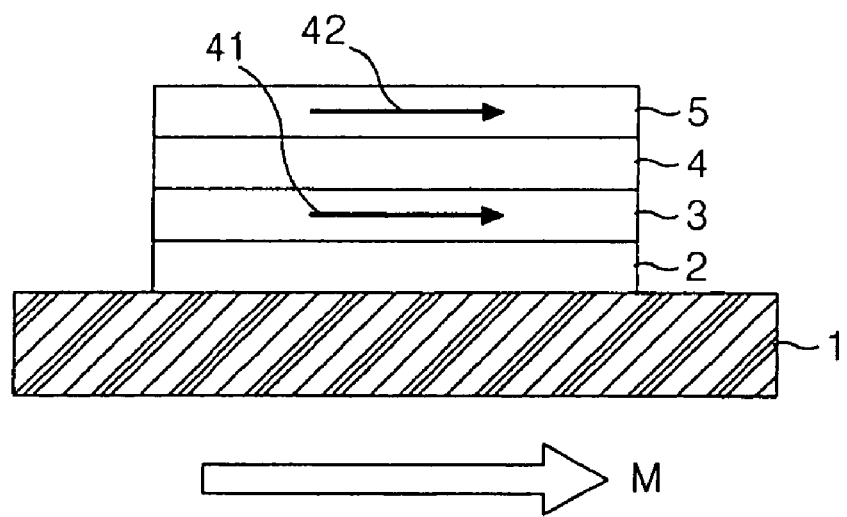
FIG. 5 is a cross sectional view illustrating a magnetization direction of a GMR sensor when an external electric field is applied.

If an external magnetic field H sufficient to magnetize the hard magnetic layer 3 is applied to the a GMR sensor, as shown in FIG. 5, the hard and the soft magnetic layers become magnetized in the direction of the external magnetic field H. In this respect, the magnetization direction of the hard magnetic layer 3 and the soft magnetic layer 5 arranges in the direction of the external magnetic field H.

Figure 6:
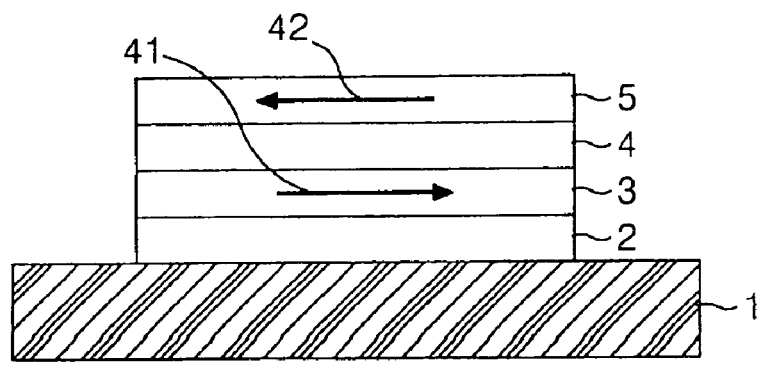
FIG. 6 is a cross sectional view illustrating a magnetization direction of a GMR sensor when an external electric field does not exist.

FIG. 6 shows that if the external magnetic field H is removed when the hard magnetic layer 3 and the soft magnetic layer 5 of the GMR sensor are magnetized, the magnetization direction 41 of the hard magnetic layer 3 is restricted by the fixed layer 2 to remain oriented in the same direction as when the external magnetic field H is applied. However, the magnetization direction 42 of the soft magnetic layer 5 with a low saturated magnetic field is arranged in the opposite direction to the external magnetic field H by an antiferromagnetic coupling. That is, if the external magnetic field H is removed, the magnetization direction 42 of the soft magnetic layer 3 is oriented in the opposite direction to the external magnetic field H.

Figure 7:
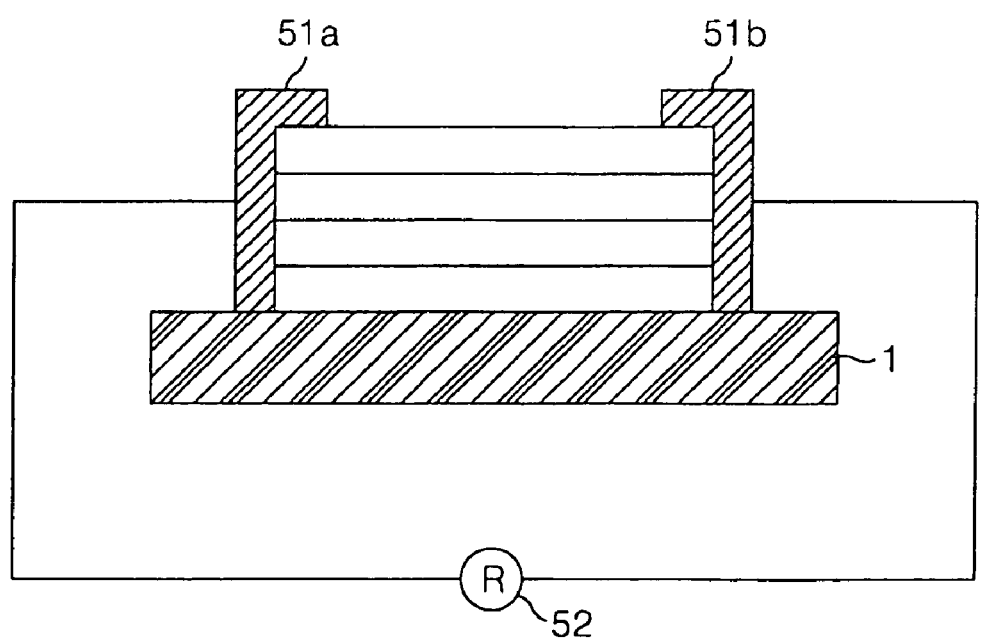
FIG. 7 is a circuit diagram illustrating a resistance detector connected to a GMR sensor.

FIG. 7 shows that after the electrodes 51a and 51b are formed in both sides of the GMR sensor, the resistance detecting circuit 52 is connected to the electrode 51a and 51b. FIGS. 5 and 6, show that if the external magnetic field H is applied to the GMR sensor or is removed, then the resistance detected by the resistance detecting circuit 52 differs in accordance with the presence or the absence of the external magnetic field H.

Figure 8:
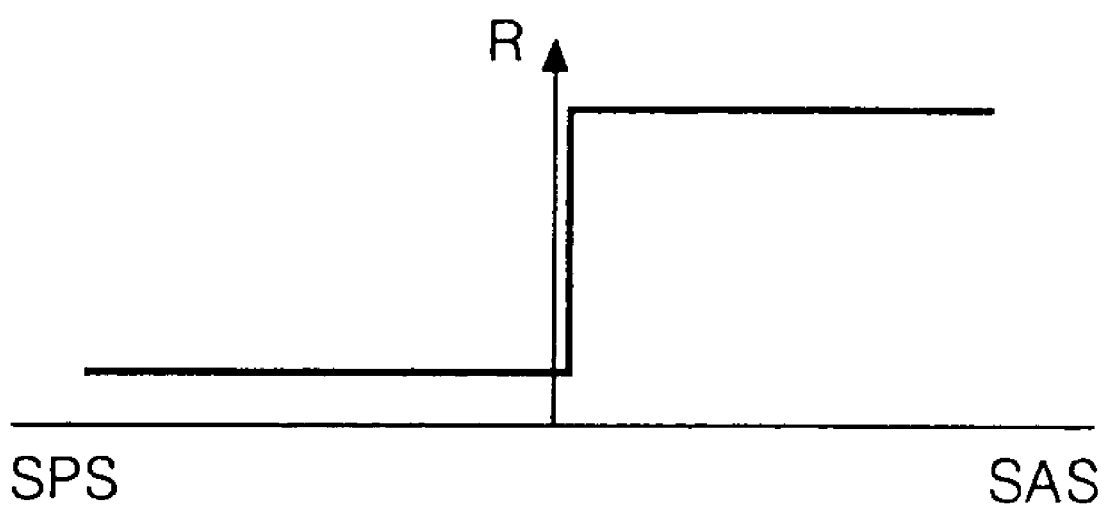
FIG. 8 is a graph illustrating the relation between magnetization state of a GMR sensor and resistance.

The resistance detecting circuit 52 generates current flow between the electrodes 51a and 51b formed on both sides of the GMR sensor, and detects the current depending on the current change. FIG. 5 shows that when the external magnetic field H is applied in a spin parallel state SPS where in the magnetization direction 41 and 42 of the hard magnetic layer 3 and the soft magnetic layer 5 are arranged in the external magnetic field H, a low resistance value R is detected in the resistance detecting circuit R, as is shown in FIG. 8. However, FIG. 6 shows that in a spin antiparallel state SAS where the external magnetic field H is removed and the magnetization direction 42 of the soft magnetic layer 5 is inverted, a high resistance value R is detected in the resistance detecting circuit R, as is shown in FIG. 8.

The method and apparatus of inspecting a flat display device according to an embodiment of the invention determines signal wire defects and a pixel electrode defects of the flat display device by using the resistance change of the GMR sensor.

Figure 9:
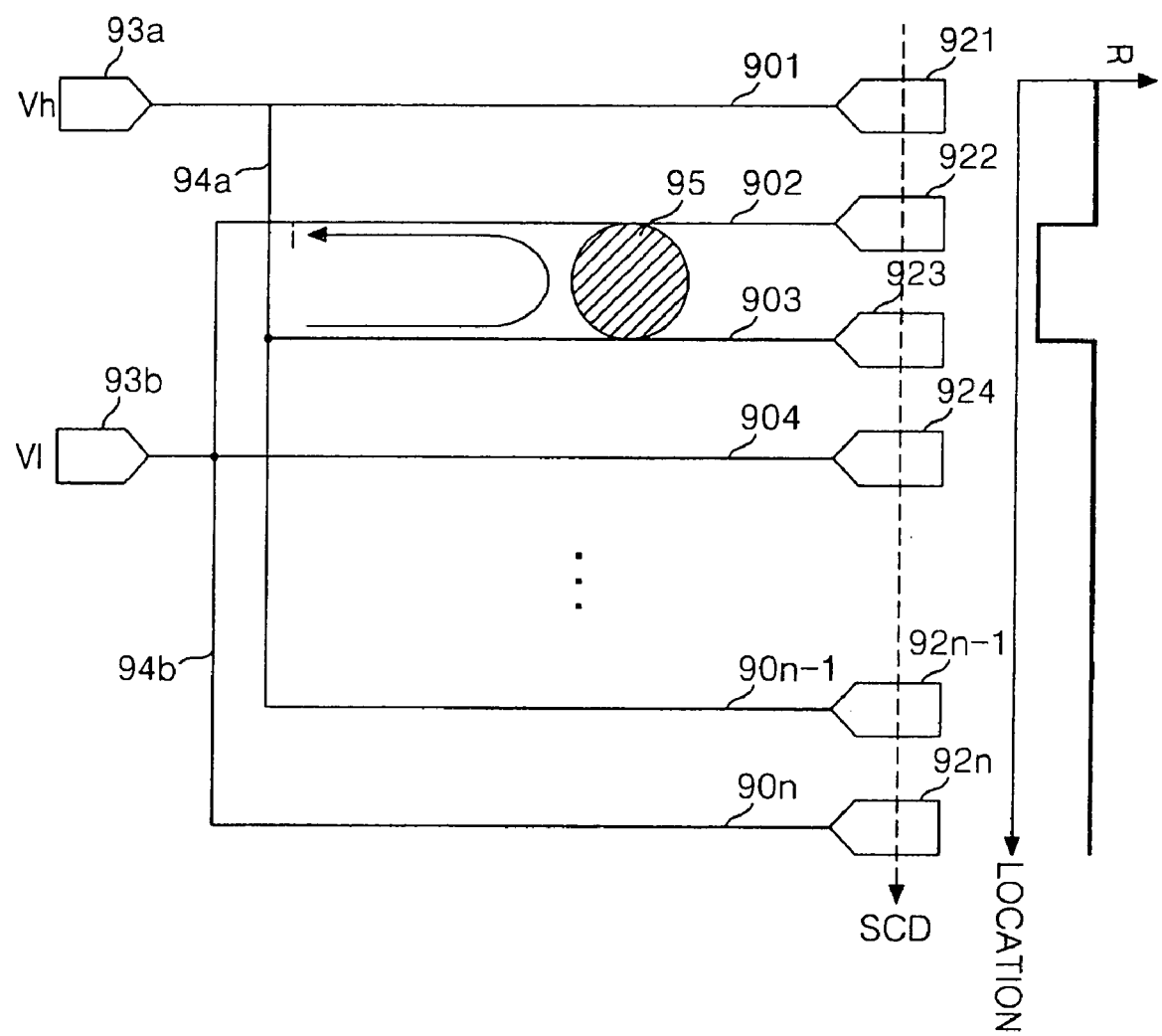
FIG. 9 illustrates a method and apparatus for inspecting a flat display device according to a first embodiment of the invention.

FIG. 9 shows a method and apparatus for inspecting a flat display device according to the first embodiment of the invention. A high common voltage Vh is supplied to one side of odd-numbered signal wires 901, 903, . . . , 90n−1 while a low common voltage V1 is supplied to one side of even-numbered signal wires 902, 904, . . . , 90n. Scan pads 921 to 92n connected to the other side of each of the signal wires 901 to 90n are scanned to inspect for shorts in the signal wires 901 to 90n.

The signal wires 901 to 90n include scan signal wires (or gate wires or row wires) or data signal wires (or column wires).

The odd-numbered signal wires 901, 903, . . . , 90n−1 are connected to a first shorting wire 94a in one side, are shorted mutually and maintain electrical insulation with the even-numbered signals 902, 904, . . . , 90n. The first shorting wire 94a connects to a first inspection pad 93a to which a high common voltage Vh is supplied. The even-numbered signal wires 902, 904, . . . , 90n connect to a second shorting wire 94b at one side, are shorted mutually and maintain an electrical insulation with odd-numbered signals 901, 903, . . . , 90n−1. The second shorting wire 94b is connected to a second inspection pad 93b to which a low common voltage V1 is supplied.

Upon inspecting for shorts on the signal wires 901 to 90n, the GNR sensor scans along the pads 921 to 92n connected to each of the signal wires 901 to 90n using a non-contacting method. FIG. 11 shows that if it is assumed that the second and the third signal wires 902 and 903 are shorted by an impurity or a pattern defect caused during the manufacturing process, the current i does not flow in the first signal wire 901 and the fourth to the Nth signal wires 904 to 90n, but the current i flows via a shorted point 95 (see FIG. 9) in the second and the third signal wires 902 and 903. The current i flows at this time from the third signal wire 903 to the second signal wire 902 since the high voltage Vh is applied to the odd-numbered signal wires 901, 903, . . . , 90n−1, and the low voltage Vl is applied to the even-numbered signal wires. The current i then flows between the second signal wire 902 and the third signal wire 903, and the induced magnetic field M causes the current i to flow in the GMR sensor 200 (see FIG. 10). On the other hand, as shown in FIG. 11, since the current i does not flow in the first signal wire 901 and the fourth to the Nth signal wires 904 to 90n, the magnetic field is not applied to the GMR sensor 200.

The resistance detector 52 connects to both sides of the GMR sensor 200 and detects the resistance R depending on the current flowing in the GMR sensor 200. The resistance R detected when the GMR sensor 200 scans the second and the third signal wires 902 and 903 is detected by a smaller value than a designated reference value, because the magnetization directions 41 and 42 of the hard magnetic layer and the soft magnetic layer of the GMR sensor 200 are arranged in the same direction as the induced magnetic field M. On the other hand, the resistance R detected when the GMR sensor 200 scans the first signal wire 901 and the fourth to the Nth signal wires 904 to 90*n* has a larger value than a designated reference value, because the magnetization direction 42 of the soft magnetic layer of the GMR sensor 200 is inverted.

Figure 12:
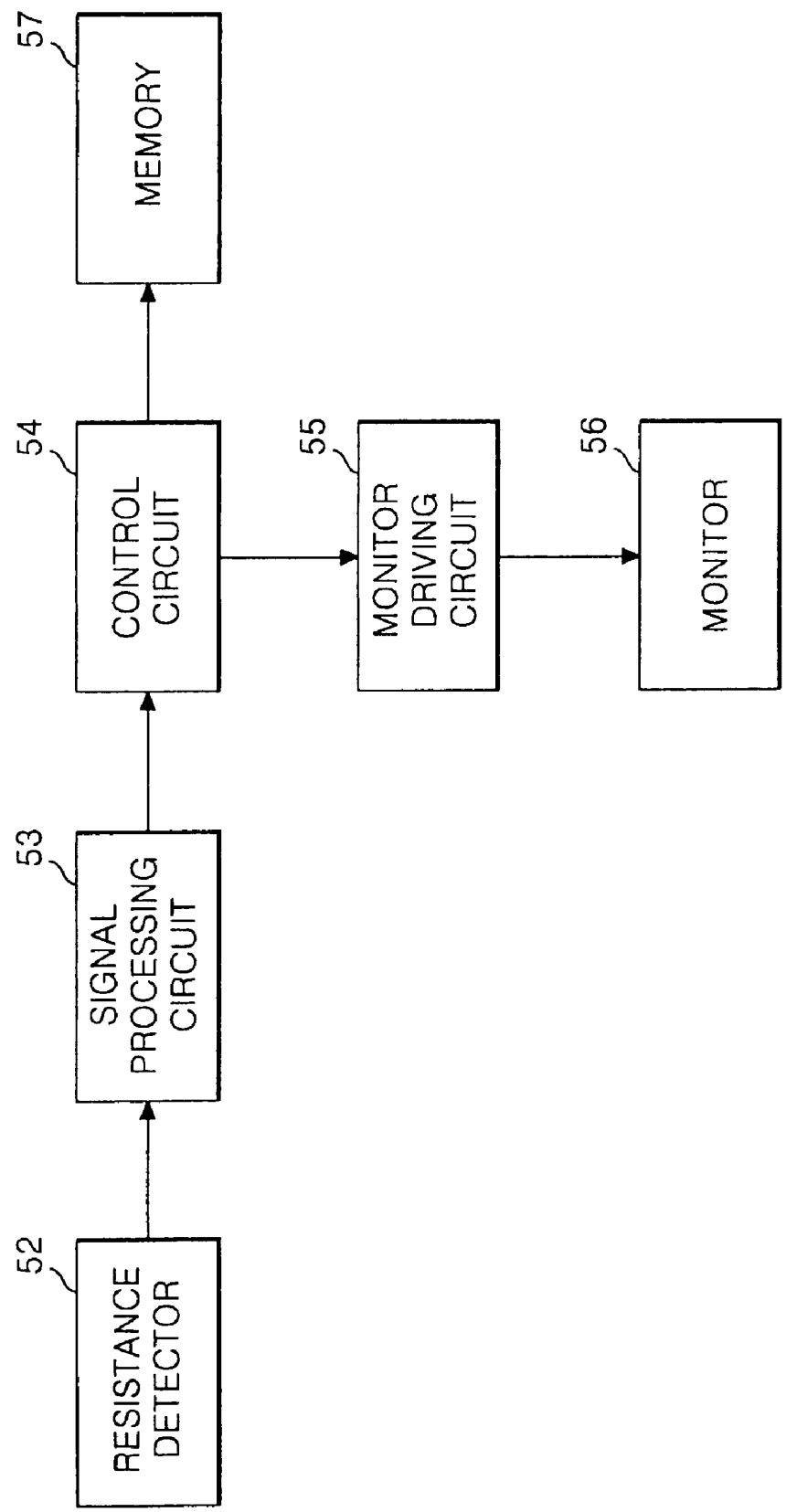
FIG. 12 is cross sectional view illustrating a magnetization direction of a GMR sensor when a current does not flow in the signal wire shown in FIG. 9.

The resistance value detected by the resistance detector 52 is converted into a digital signal by a signal processing circuit 53 shown in FIG. 12 and then is amplified before being displayed on the monitor 56 under control of a control circuit 54 and a monitor driving circuit 55. Accordingly, the inspector sees the resistance value displayed on the monitor 56 and thereby determines shorts in the second and the third signal wires 902 and 903.

The control circuit 54 temporarily stores data from the signal processing circuit 53 in the memory 57 and determines a short in the signal wire by comparing reference data that forms a reference value for the detected data stored in the memory.

Figure 13:
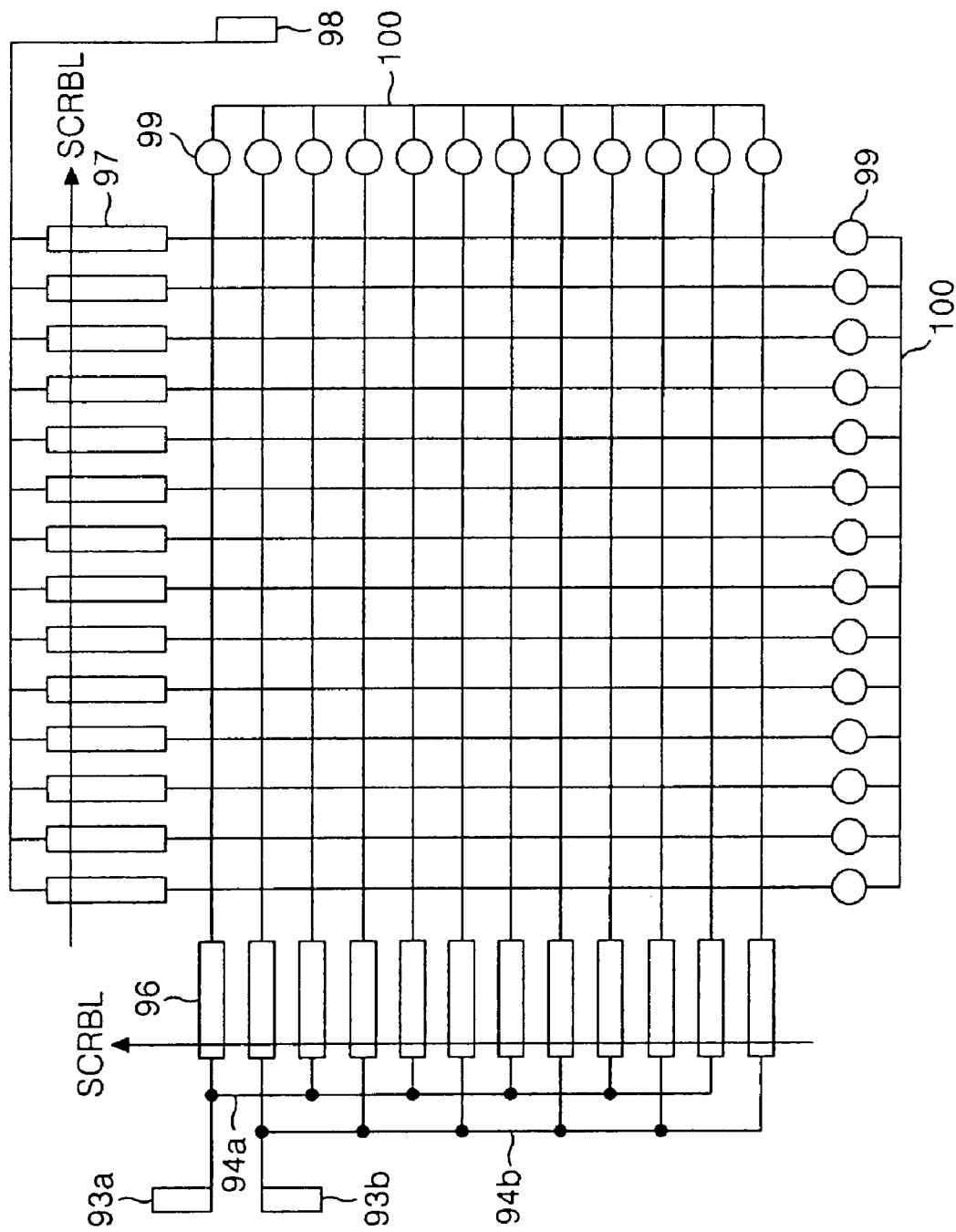
FIG. 13 is a block diagram illustrating a detecting apparatus for a flat display device according to an embodiment of the invention.

FIG. 13 shows that after the inspection process, the inspection pads 93*a* and 93*b* and the shorting wires 94*a* and 94*b* are separated from the TFT array during the scribing process. During the scribing process, the substrate is cut off along a scribing line SCRBL crossing the signal pads 96 and 97. In FIG. 13, a reference numeral '96' is a scan signal pad connected to the scan signal wire and reference numeral '97' is a data pad connected to the data wire crossing the scan signal wires. Reference numeral '98' is an inspection data for supplying a data voltage to the data wires during the inspection process. Reference numeral '99' is a device that protects against electrostatic discharge damage (hereinafter referred to as "ESD protection device"). One terminal of the ESD protection device is connected to the data wires or the scan signal wires, and the other terminal is connected to an ESD shorting line 100 to which a ground voltage GND or common voltage is supplied. When static electricity arises in the TFT array during the manufacturing process or normal driving, the ESD protection device bypasses the static electricity to the ESD shorting line 100 to thereby protect the TFT array from the static electricity damage.

Figure 14:
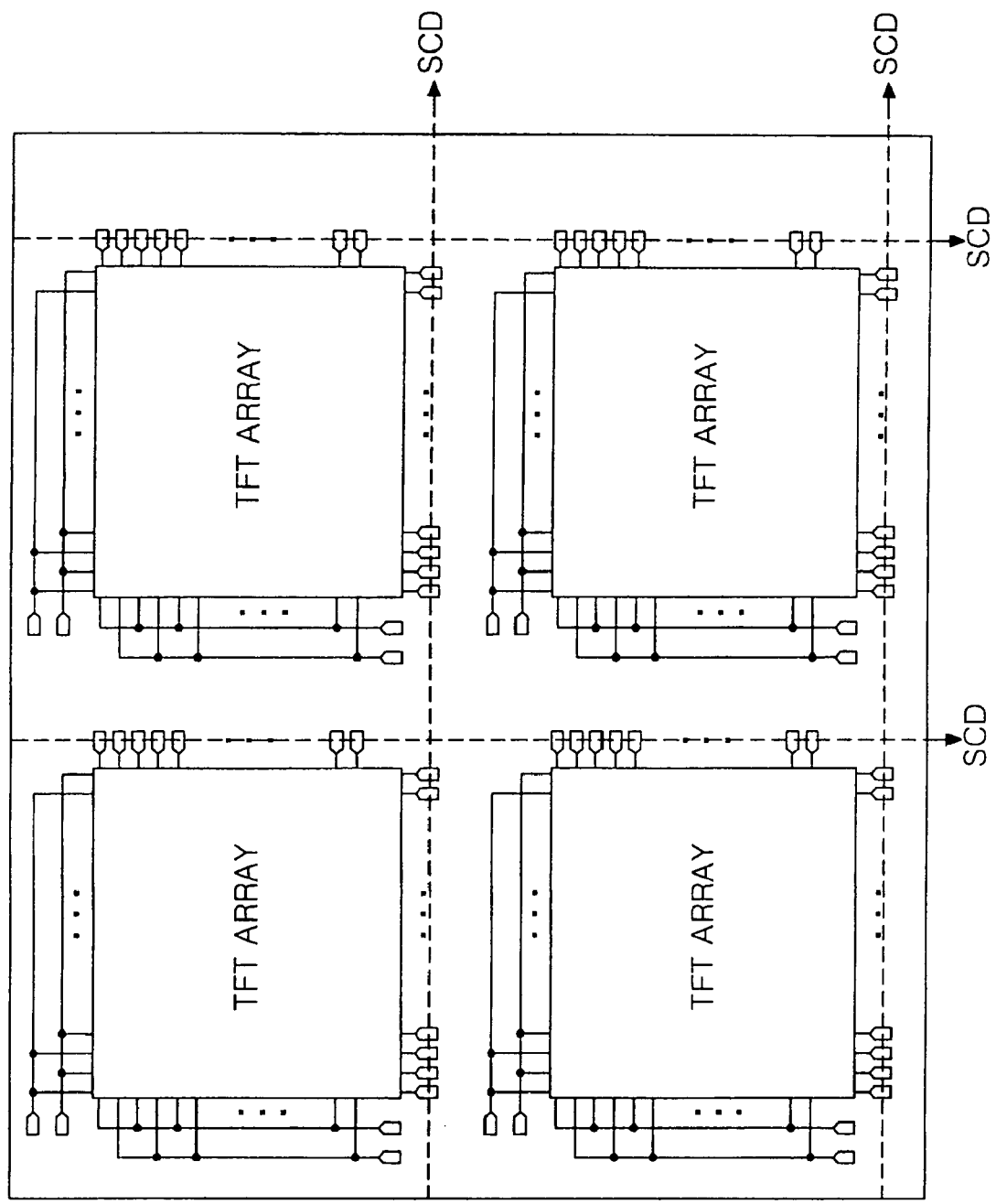
FIG. 14 illustrates a scan method on a substrate before a scribing process with respect to a method and apparatus for inspecting a flat display device according to a first embodiment of the invention.

FIG. 14 shows that the short inspection on the signal wires 901 to 90*n* can be collectively carried out with respect to the substrate having multiple TFT arrays formed thereon before being subjected to scribing process. In this case, the GMR sensor 200 scans in the scan direction SCD crossing the pads, each of which respectively connected to the signal wires 901 to 90*n*, to detect the current and the resistance.

FIGS. 15 to 18 are diagrams illustrating the method and apparatus for inspecting a flat display device according to a second embodiment of the invention, which shows an inspection method where the signal wires formed in different layers are respectively shorted.

Figure 15:
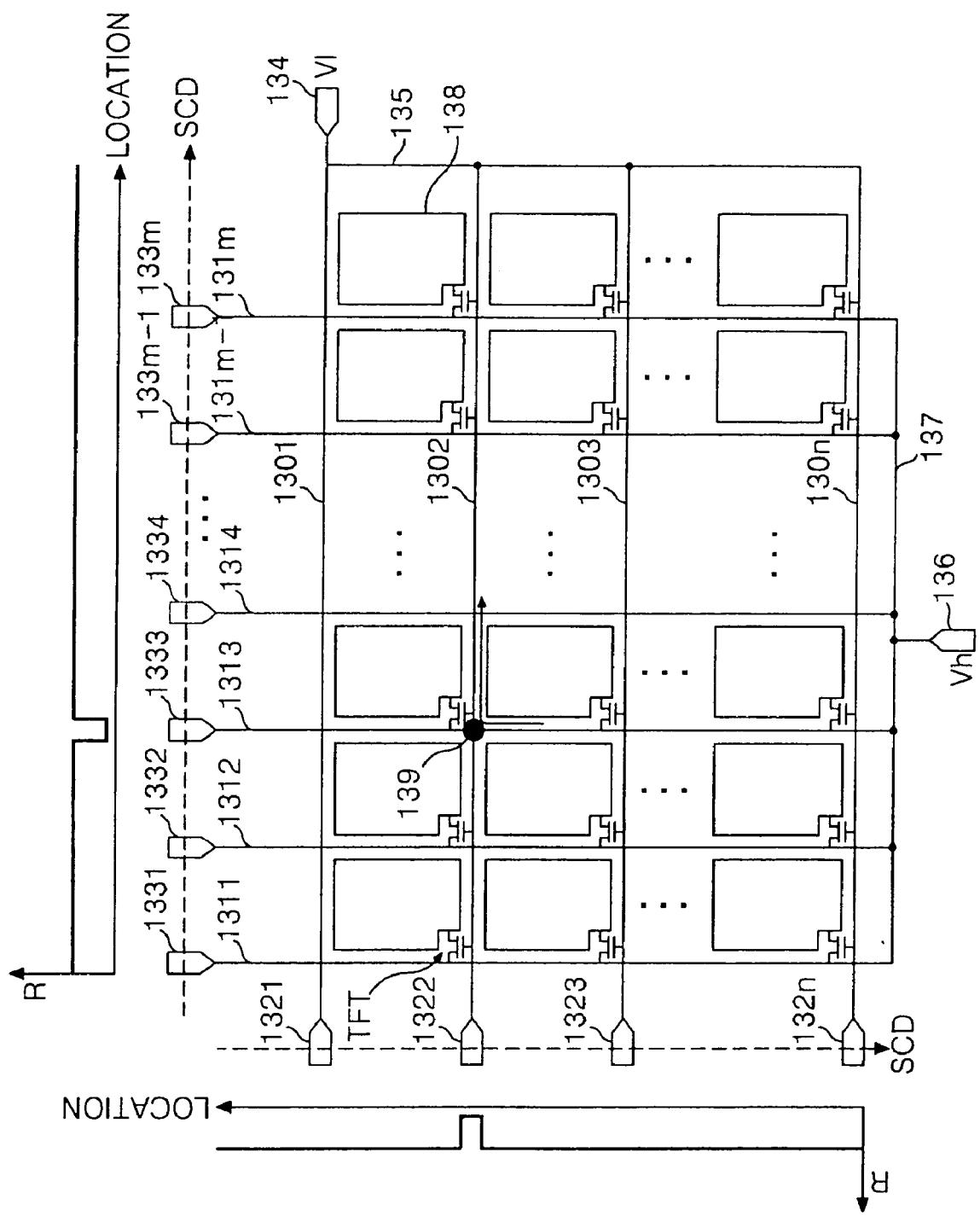
FIG. 15 illustrates a method and apparatus for inspecting a flat display device according to a second embodiment of the invention.

Referring to FIG. 15, the method and apparatus for inspecting the flat display device according to the second embodiment of the invention supplies the high common voltage Vh to one side of the data signal wires 1311 to 131*m* and supplies the low common voltage V1 to one side of the scan signal wires (or gate wires or row wires) 1301 to 130*n* crossing the data signal wires (or column wires) 1311 to 131*m*.

The data signal wires 1311 to 131*m* are connected to the first shorting wires 137 on one side. The first shorting wire 137 is connected to the first inspection pad 136 to which the high common voltage Vh is supplied.

The scan signal wires 1301 to 130*n* connect to the second shorting wires 135 on one side. The second shorting wire 135 connects to the second inspection pad 134 to which the low common voltage V1 is supplied.

Figure 10:
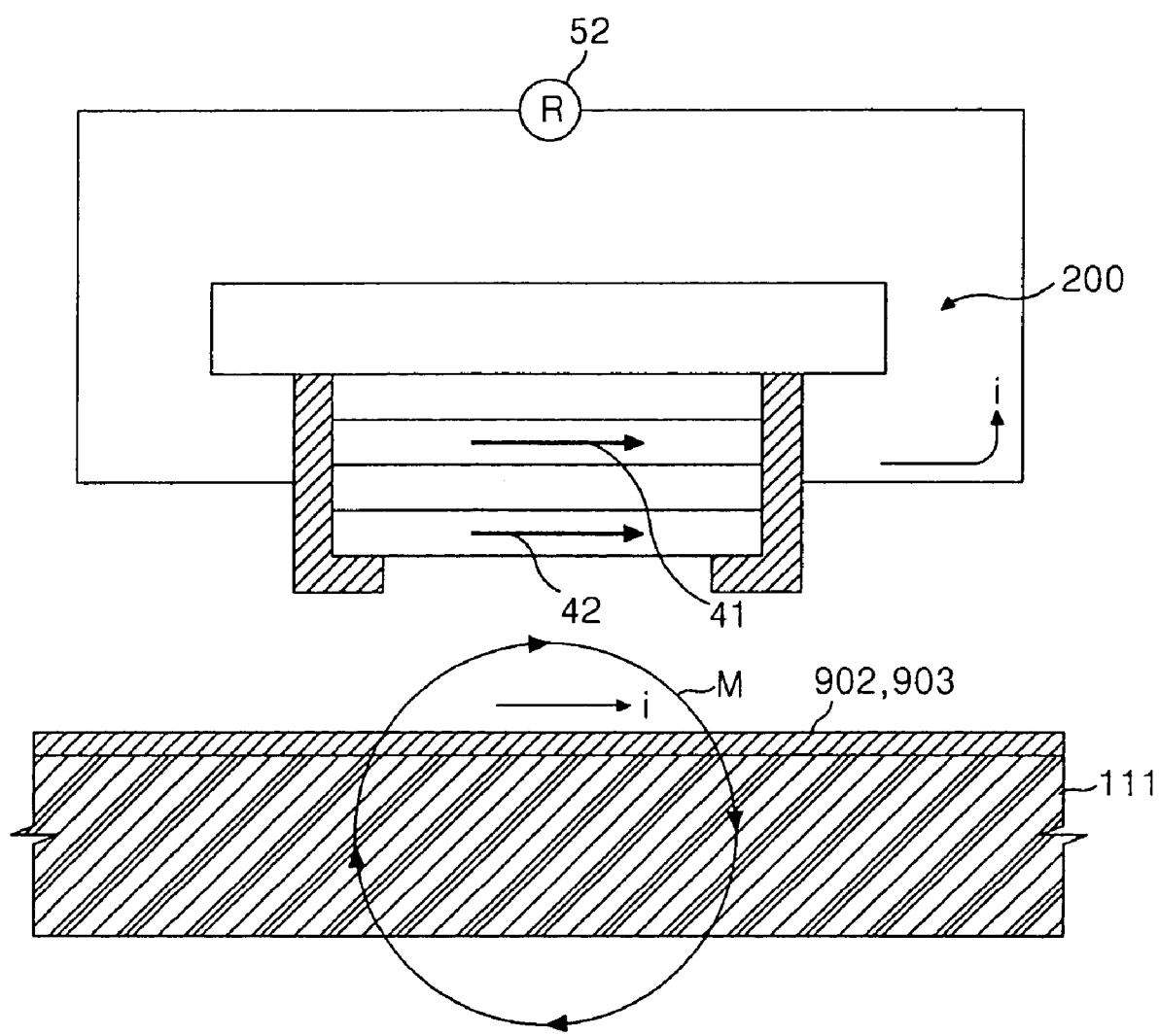
FIG. 10 is a plane view illustrating a scribing line SCRL.
Figure 11:
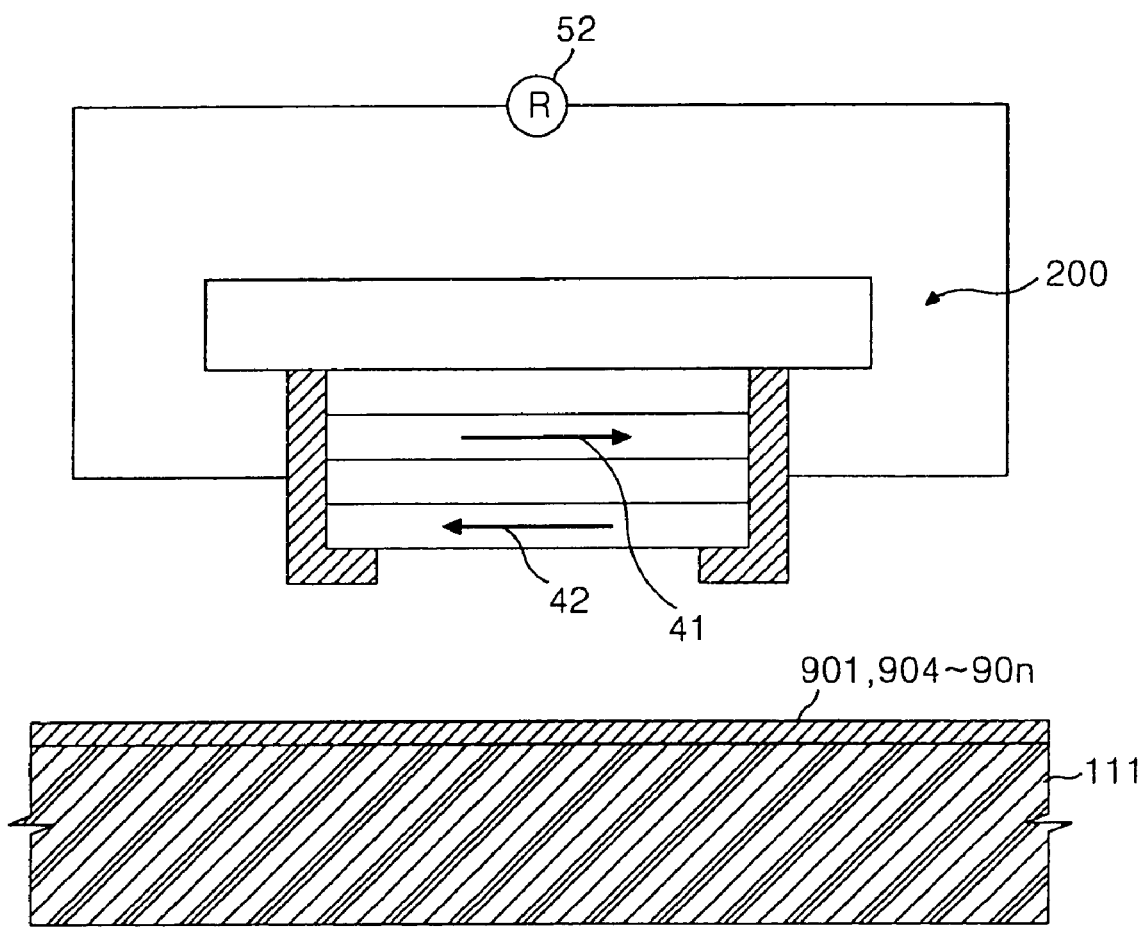
FIG. 11 is a cross sectional view illustrating a magnetization direction of a GMR sensor when current flows in the signal wire shown in FIG. 9.

After the inspecting process, the inspection pads 134 and 136 and the shorting wires 135 and 137 are separated from the TFT array during the scribing process as shown in FIG. 10.

If the flat display device is a liquid crystal display device, the TFTs are formed at each of the intersections of the data signal wires 1311 to 131*m* and the scan signal wires 1301 to 130*n*. When the scan voltage higher than its own threshold voltage is applied, the TFT is turned-on to supply the data voltage through the data signal wires 1311 to 131*m* to the pixel electrode 138.

The method and apparatus for inspecting the flat display device according to the second embodiment of the invention scans the data signal wires 1311 to 131*m* on the pads 1331 to 133*m* connected to the other side of the data signal wires 1311 to 131*m* by using the GMR sensor 200. Also, the method scans the scan signal wires 1301 to 130*n* on the pads 1321 to 132*n* connected to the other side of the scan signal wires 1301 to 130*n* by using GMR sensor 200, and inspects for an interlayer short between signal wires 1311 to 131*m*, 1301 to 130*n* formed on a different layer.

Figure 16:
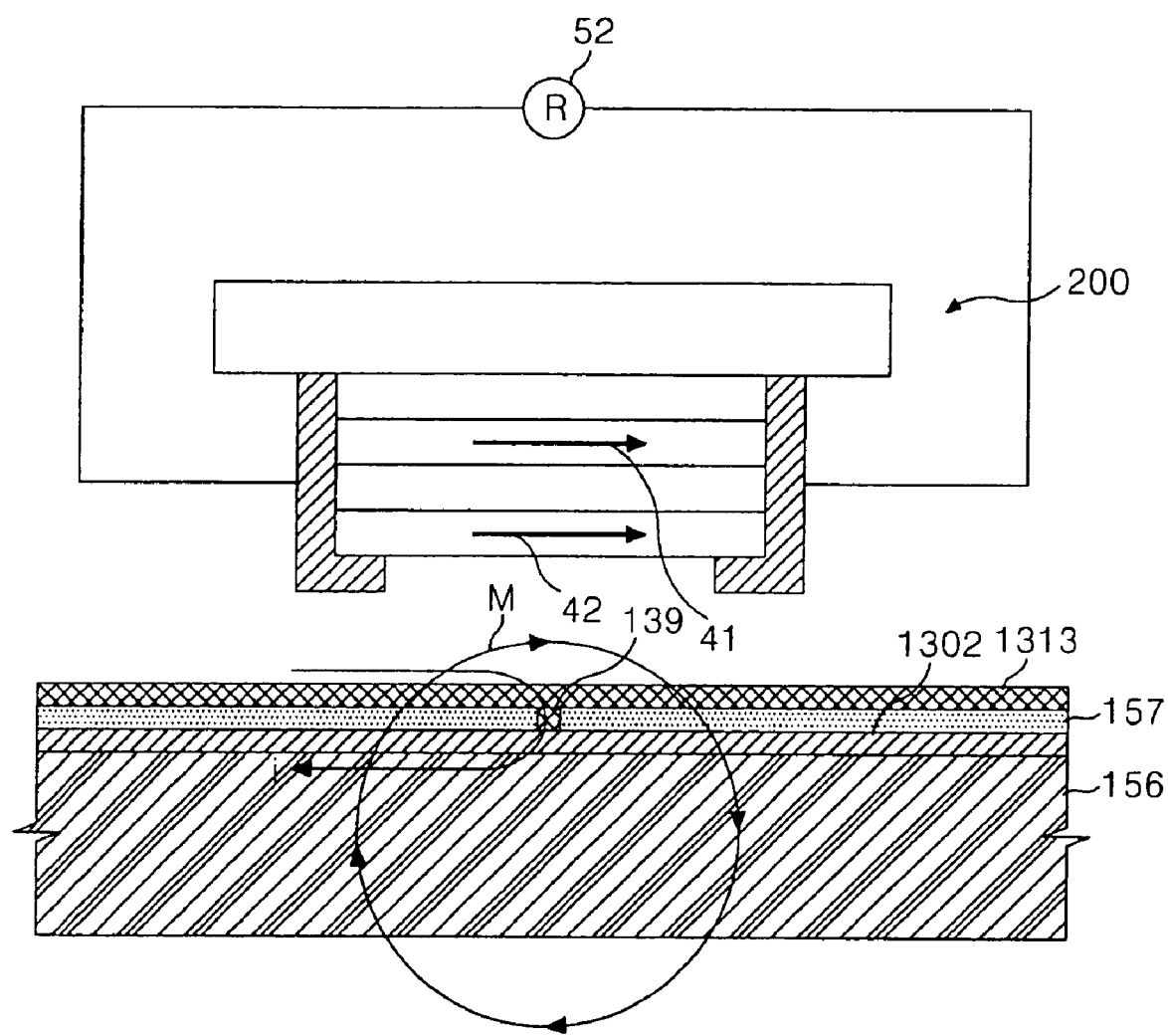
FIG. 16 is a cross sectional view illustrating a magnetization direction of a GMR sensor when current flows in the signal wire shown in FIG. 15.
Figure 17:
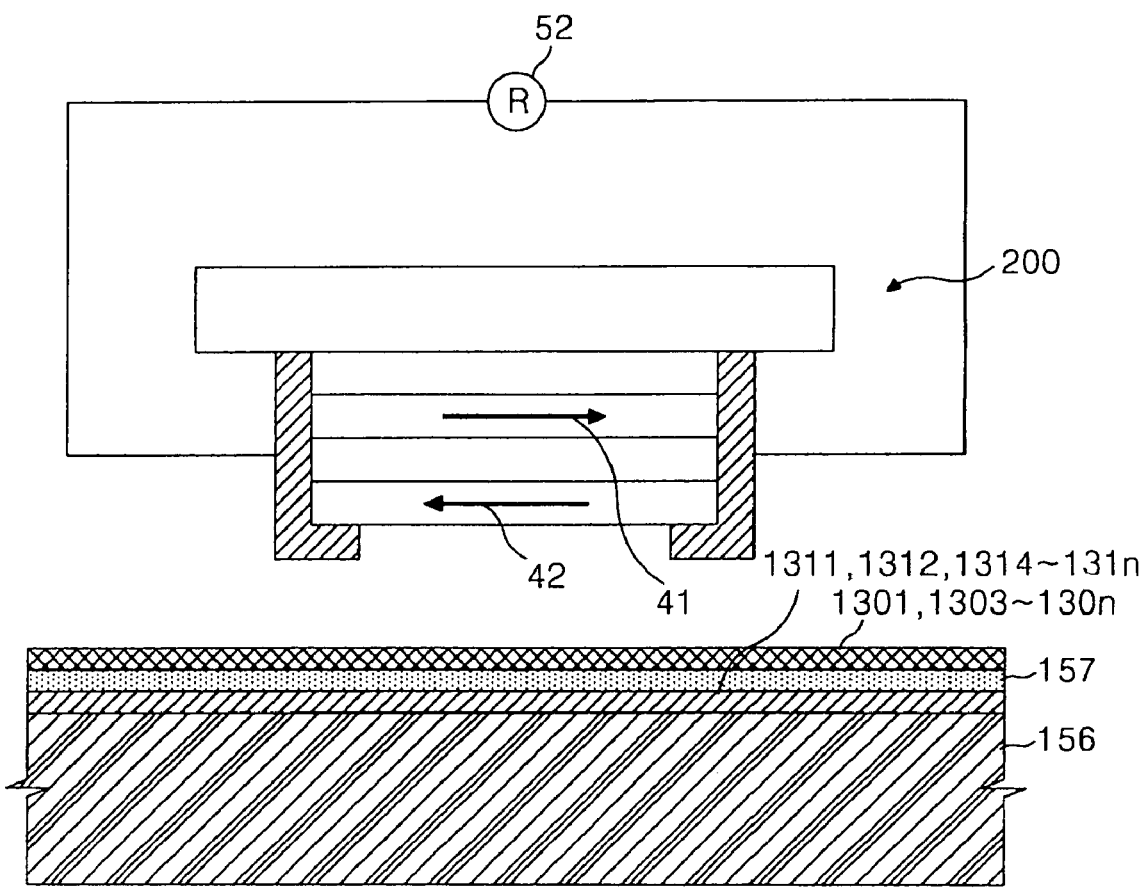
FIG. 17 is a cross sectional view illustrating a magnetization direction of a GMR sensor when current does not flow in the signal wire shown in FIG. 15.

FIGS. 16 and 17 show the insulation layer 157 being formed between the data signal wires 1311 to 131*m* and the scan signal wires 1301 to 130*n*.

Upon inspecting the interlayer short between the data signal wires 1311 to 131*m* and the scan signal wires, the GMR sensor 200 scans by a non-contacting method along the scan direction SCD crossing the scan signal pads 1321 to 132*n*, and then scans by the non-contacting method along the scan direction SCD crossing the data pads 1331 to 133*m*. Alternatively, the GMR sensor may scan by a non-contacting method along the data pads 1331 to 133*m* and then scan by the non-contacting method along the scan signal pad 1321 to 132*n*.

In the location where the data signal wires 1311 to 131*m* and the scan signal wires 1301 to 130*n* cross the data signal wires 1311 to 131*m* and the scan signal wires 1301 to 130*n*, shorts occur when the insulation layer 97 is lost due to defects arising from the deposition process or the patterning process. FIG. 14 shows that if the third data signal wire 1313 and the second scan signal wire 1302 are shorted, because the low common voltage V1 is supplied to the scan signal wires 1301 to 130*n* and the high common voltage Vh is supplied to the data signal wires 1311 to 131*m*, the current i flows between the third data signal wire 1313 and the second scan signal wire 1302 via the short point 139. The current i flows from the third scan signal wire 1313 to the second scan signal wire 1302. If the current flows as described above, the GMR sensor 200 detects the induced magnetic field M. The current thus flows, induced by the magnetic field M, when the GMR sensor 200 scans the third data pad 1333 and the second scan signal pad 1322, as shown in FIG. 16. A resistance R lower than the designated reference value is detected, since the magnetization direction 41 and 42 of the hard magnetic layer and the soft magnetic layer of the GMR sensor 200 in the resistance detector 52 have the same direction as the induced magnetic field M.

On the other hand, although the low common voltage V1 is applied to the scan signal wires 1301 to 130*n* and the high common voltage Vh is applied to the data signal wires 1311 to 131*m*, the current i does not flow if there is no short pointing between the first, the second, the fourth to the Mth data signal wires 1311, 1312, 1314 to 131m and the first, the third to the Nth scan signal wires 1301, 1303 to 130n, as shown in FIG. 17. Then, when the GMR sensor 200 scans the first, the second, the fourth to the Mth data pads 1331, 1332, 1334 to 133m and the first, the third and the Nth scan signal wires 1321, 1323 to 132n, the resistance R higher than the designated reference value is detected because the induced magnetic field M is not detected by the GMR sensor 200 and the magnetization direction 42 of the soft magnetic layer of the GMR sensor 200 in the resistance detector 52 is inverted.

If the current i or the resistance R is detected when the GMR sensor 200 scans the data pads 1331 to 133m, and the current i or if the resistance R is detected when the GMR sensor 200 scans the scan signal pads 1321 to 132n, then the exact location where the interlayer short point 130 exists can be detected.

FIG. 13 shows that the resistance value detected by the resistance detector 52 converts into a digital signal, and then it is amplified by the signal processing circuit 53 before being displayed on the monitor 56 under control of the control circuit 54 and the monitor driving circuit 55. Accordingly, the inspection operator perceives the resistance value displayed on the monitor and can detect any interlayer short between the data signal wires 1311 to 131m and the scan signal wires 1301 to 130n.

Figure 18:
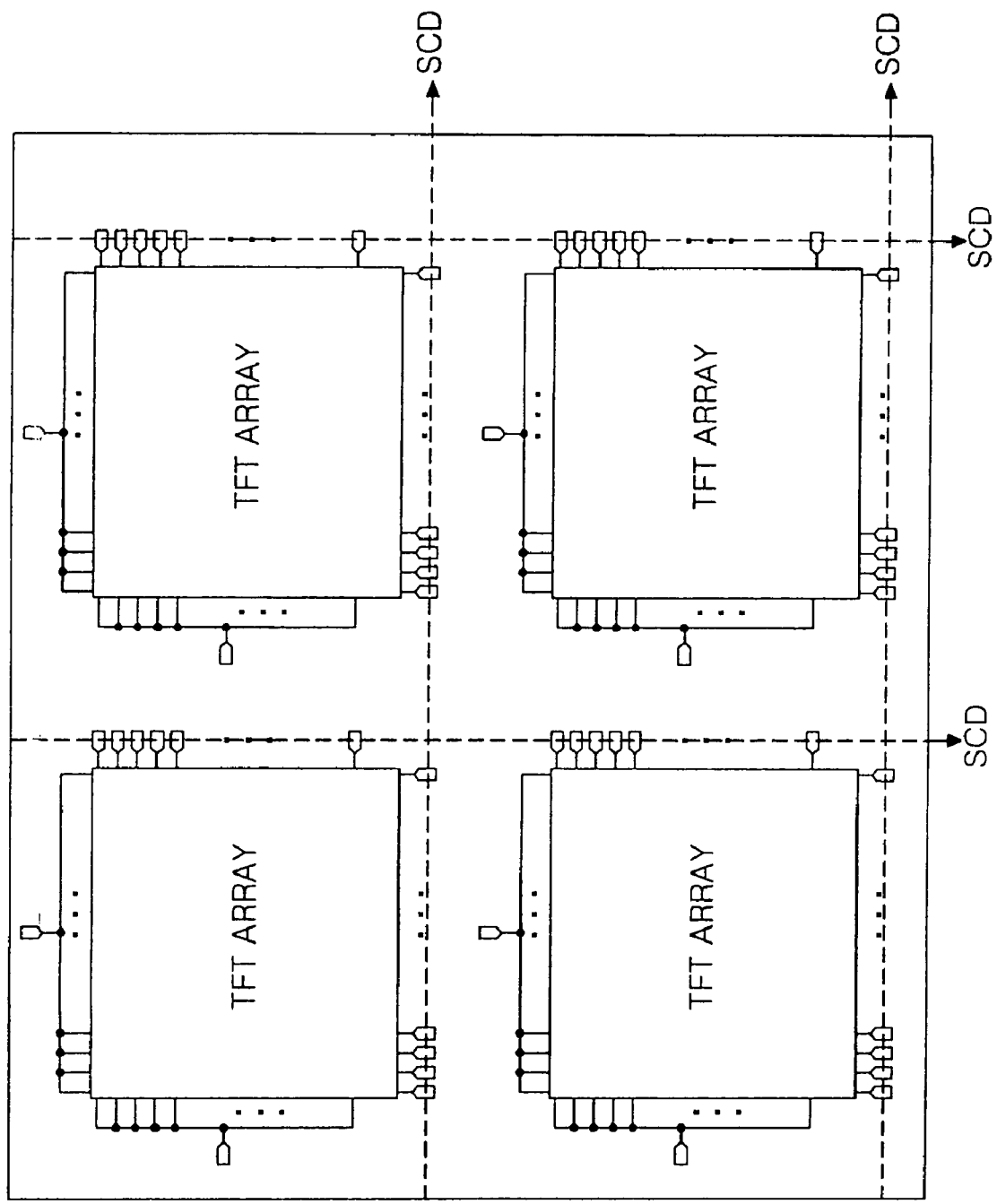
FIG. 18 illustrates a scan method on a substrate before a scribing process with respect to a method and apparatus for inspecting a flat display device according to a second embodiment of the invention.

The inspection for interlayer shorts between the data signal wires 1311 to 131m to the scan signal wires 1301 to 130n, as shown in FIG. 18, can be collectively carried out with respect to a substrate having a multiple TFT arrays formed thereon, before being subjected to the scribing process. In this case, the GMR sensor 200 scans in the scan direction SCD proceeding along the data signal wires 1311 to 131m and the scan signal wires 1301 to 130n to detect the current and the resistance.

Figure 19:
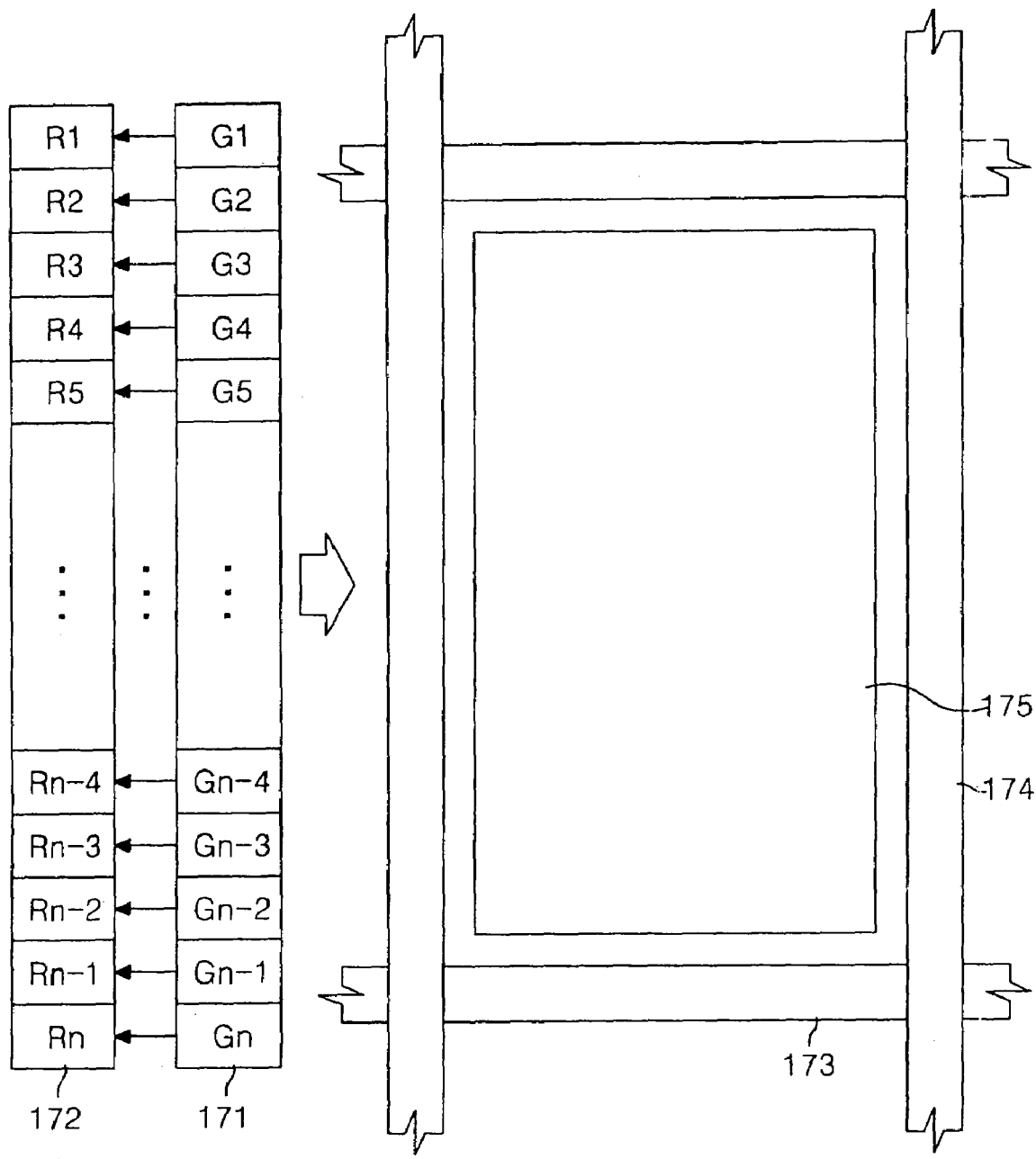
FIG. 19 illustrates a method and apparatus for inspecting a flat display device according to a third embodiment of the invention.
Figure 20A:
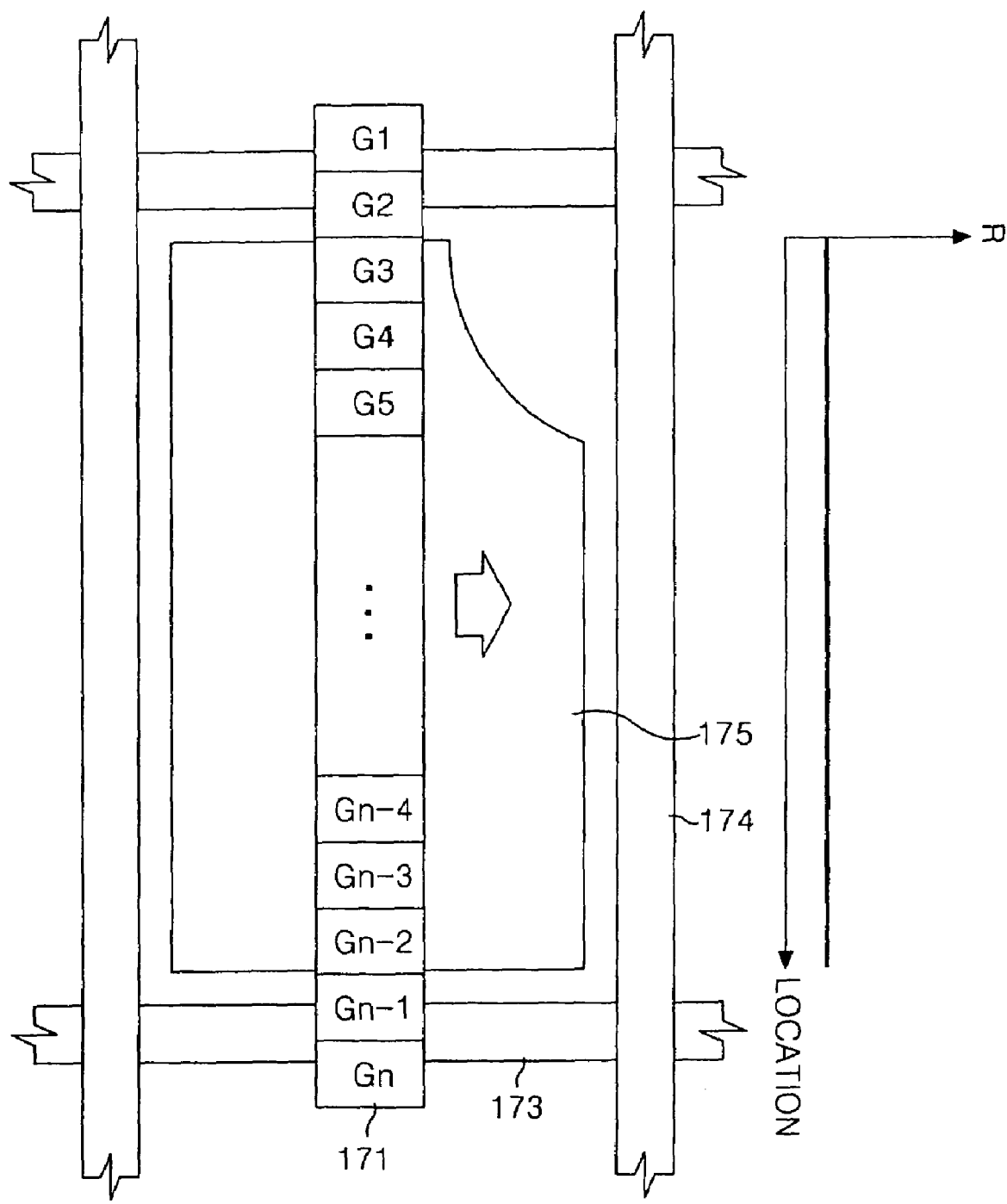
FIGS. 20*a* and 20*b* illustrate a movement of the sensor array shown in FIG. 19.
Figure 20B:
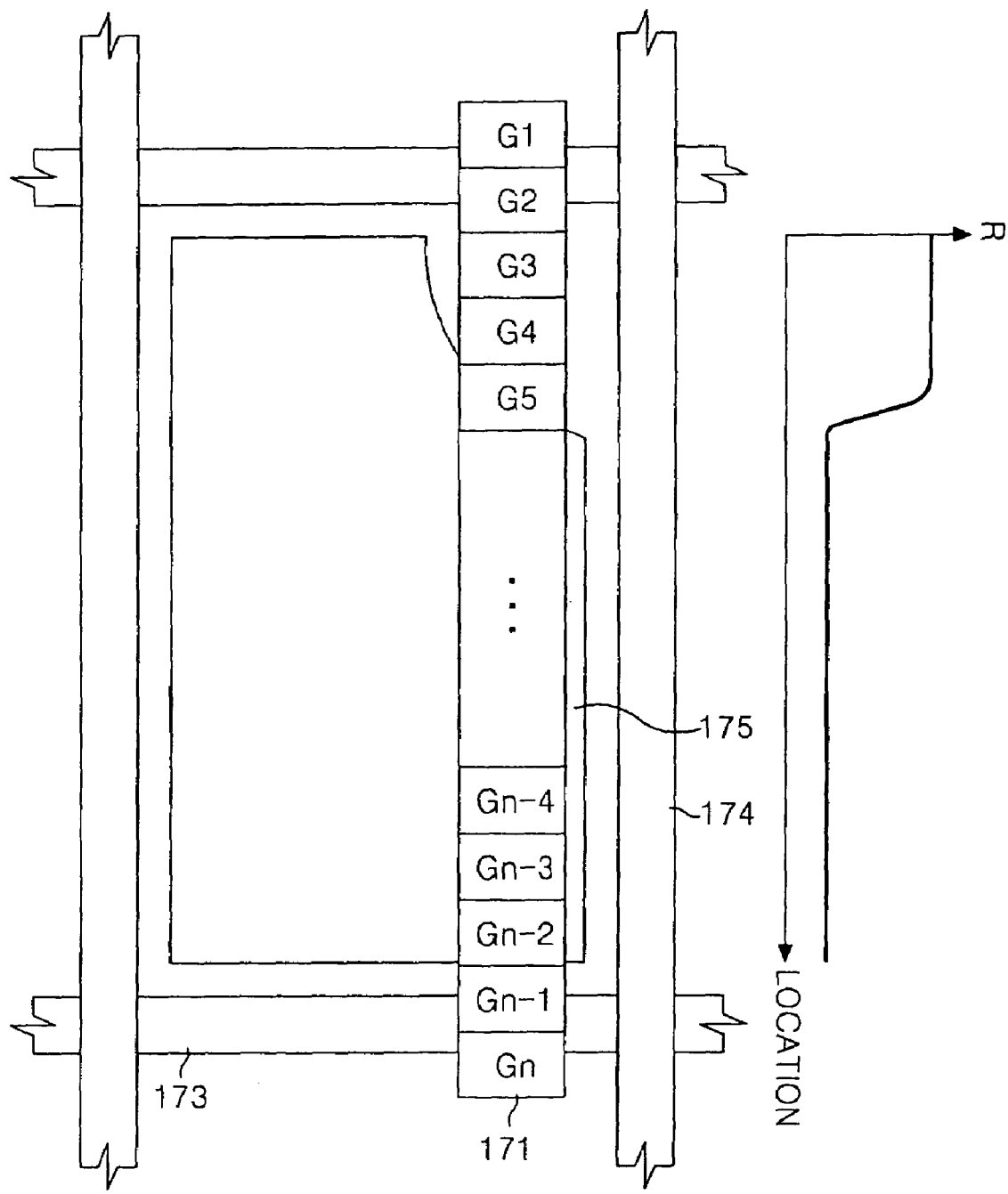

FIGS. 19 to 20b are diagrams illustrating a method and apparatus for inspecting a flat display device according to a third embodiment of the invention, which tests for bad pixel electrodes.

FIG. 19 shows the method and apparatus for inspecting the flat display device according to a third embodiment of the present invention that includes a sensor array that has multiple GMR sensors G1 to Gn.

The GMR sensors G1 to Gn are patterned and are below the pixel in size. The N number of GMR sensors G1 to Gn are patterned minutely below the size of the pixel in the sensor array 171, and they are disposed in a row. The sensor array 171 scans in a direction (shown by the arrow) in an arranged state in which the GMR sensors G1 to Gn are parallel to the data signal wires 174. Each of the GMR sensors G1 to Gn supply to the resistance detector 172 a current signal detected from the scan signal wires 173, the data signal wires 174 and the pixel electrode 175. The resistance detector 172 detects the resistance R depending on the current detected from each of the GMR sensors G1 to Gn of the sensor array 171.

FIGS. 20a and 20b show that the first GMR sensor G1 and the Nth GMR sensor Gn of the sensor array 171 may be used for a short inspection of the scan signal wires 173. The first to the Nth sensors G1 to Gn of the sensor array 171 may be used for a short inspection of the data signal wires 174. Further, the third to the (N-2)th GMR sensors G3 to Gn-2 of the sensor array 171 may be used to inspect for pattern defects of the pixel electrode 175. Since the above description is made regarding the short inspection of the signal wires 173 and 174, the following description will be made to the embodiment of inspecting for pattern defects in the pixel electrode 175.

A current is applied to the pixel electrode 175 via the TFTs (not shown), and the data signal wires 174 as similar to an electroluminescence El display device when inspecting for pattern defects of the pixel electrode 175.

When the sensor array 171 scans in the direction, shown by the arrow, when the current is supplied via the data signal wire 174 in the pixel electrode 175, the magnetic field M is induced from the pixel electrode 175 in the third to the (N-2)th GMR sensors G3 to Gn-2 of the sensor array 171 if the sensor array 171 reaches the location shown in FIG. 20a. Accordingly, as shown in FIG. 20a, the third to the (N-2)th GMR sensors G3 to Gn-2 detect the current i and the resistance detector 172 detects the resistance R less than the designated reference value by the current i detected from the GMR sensors G3 to Gn-2.

If the sensor array 17 moves further reach at the location shown in FIG. 20b, the magnetic field M is not induced in the third and fourth GMR sensors G3 and G4 of the sensor array 171, and the magnetic field M is induced in the fifth to the (N-2)th GMR sensors G5 to Gn-2 due to the pattern loss of the pixel electrode 175. Accordingly, as shown in FIG. 20b, the fifth to the (N-2)th GMR sensors G5 to Gn-2, scanned at the location where the pixel pattern exists, detect the current i. As a result, the resistance detector 172 detects the resistance R to be less than the designated reference value by the current i detected from the GMR sensors G5 to Gn-2. On the other hand, the third and the fourth GMR sensors G3 and G4 scanned at the location where the pattern of the pixel electrode 175 is lost cannot detect the current i and the resistance detector 172 connected to the GMR sensors G3 and G4 detect the resistance R more than the designated reference value.

As described above, the method and apparatus for inspecting the flat display device according to the invention detects a short in the signal wire, a short in the interlayer signal wire and a bad electrode pattern by using a magnetic sensor to thereby increase an inspection precision and inspection speed.

Although the present invention has been explained by the embodiments shown in the drawings described above, it should be understood to a person having ordinary skilled in the art that the invention is not limited to the embodiments, but rather that various changes or modifications thereof are possible without departing from the spirit of the invention. For example, though the method and apparatus that is capable of carrying out the electrical inspection for a short in the signal wire and pattern defects by using the GMR sensor has been explained, the inspection can be performed using other sensors such as a fluxgate sensor, inductive sensor, etc. Accordingly, the scope of the invention shall be determined only by the appended claims and their equivalents.

What is claimed is:

1. A method of inspecting a flat display device having a plurality of signal wires for shorts between neighboring signal wires, comprising:
   applying a first common voltage to one side of odd-numbered signal wires;
   applying a second common voltage to one side of even-numbered signal wires;
   scanning adjacent signal wires by using a magnetic sensor, the magnetic sensor scanning the signal wire on pads connected to an other side of the signal wires; and detecting a resistance change of the magnetic sensor to perceive a short in the signal wires.

2. The method according to claim 1, wherein detecting the resistance change of the magnetic sensor comprises:
   detecting the resistance of the magnetic sensor depending on the change of current flowing in the magnetic sensor; and
   determining the short in the signal wire if the resistance of the magnetic sensor is larger than a designated reference value.

3. The method according to claim 1, wherein the magnetic sensor includes a soft magnetic layer near to the signal wires and a hard magnetic layer over the soft magnetic layer, and wherein the magnetization direction of the soft magnetic layer is changed depending on an induced magnetic field from the signal wire.

4. The method according to claim 3, wherein perceiving the short of the signal wire includes determining the short in the signal wire when a primary magnetization direction of the soft magnetic layer is inverted.

5. A method of inspecting a liquid crystal display having a plurality of signal wires for shorts between a signal wire and a crossed scan wire, comprising:
   applying a first common voltage to one side of first signal wires;
   applying a second common voltage to one side of second signal wires;
   scanning adjacent second signal wires stacked over at least one of the first signal wires, the first and second signal wires being separated by an insulation layer, and the magnetic sensor scans the second signal wire on the pads connected to the other side of the second signal wires; and
   detecting a resistance change of the magnetic sensor to perceive an interlayer short between the first and the second signal wires.

6. The method according to claim 5, wherein perceiving an interlayer short between the first and second signal wires includes:
   detecting the resistance of the magnetic sensor depending on a change of a current flowing in the magnetic sensor; and
   determining the short of the first and second signal wire if the resistance of the magnetic sensor is larger than a designated reference value.

7. The method according to claim 5, wherein the magnetic sensor includes a soft magnetic layer near to the signal wires and a hard magnetic layer over the soft magnetic layer, and the magnetization direction of the soft magnetic layer is changed by an magnetic field induced from the first and second signal wires.

8. The method according to claim 7, wherein perceiving the interlayer short between the first and second signal wires includes determining the short of the signal wire when a primary magnetization direction of the soft magnetic layer is inverted.

9. A method of inspecting a liquid crystal display device having a plurality of signal wires, comprising:
   applying a current to an electrode pattern;
   scanning the electrode pattern by using a sensor array including one or more magnetic sensors below a pixel in size; and
   detecting the resistance change of each of the magnetic sensors to perceive defects in the electrode pattern.

10. The method according to claim 9, wherein detecting the resistance change of the magnetic sensor includes:
    detecting the resistance of the each of the magnetic sensors with the change of the current flowing to each of the magnetic sensors; and
    determining a short in a portion of the electrode pattern at the location where the resistance of the magnetic sensor is larger than a designated reference value.

11. The method according to claim 9, wherein the magnetic sensor includes a soft magnetic layer near to the signal wires and a hard magnetic layer over the soft magnetic layer, wherein the magnetization direction of the soft magnetic layer is changed by a magnetic field induced from the signal wire.

12. The method according to claim 9, wherein detecting the resistance change of each of the magnetic sensors includes determining that the electrode pattern is lost when the incipient magnetization direction of a soft magnetic layer is returned to the incipient magnetization direction at the location where the electrode pattern is lost after inverting by the induced magnetic field from the electrode pattern where the current flows.

13. An apparatus for inspecting a flat display device having a plurality of signal wires for shorts between neighboring signal wires, comprising:
    a first voltage source for supplying a first common voltage to one side of odd-numbered signal wires;
    a second voltage source for supplying a second common voltage different from the first common voltage to one side of even-numbered signal wires;
    a magnetic sensor for scanning adjacent signal wires, the magnetic sensor scanning the signal wires on pads connected to an other side of the signal wires; and
    a detecting circuit for detecting a resistance change of the magnetic sensor to perceive a short in the signal wire.

14. The apparatus according to claim 13, wherein the magnetic sensor comprises one of a giant magneto-resistance sensor, a magneto-resistance sensor, a tunneling magneto-resistance sensor, a fluxgate sensor or an inductive sensor.

15. The apparatus according to claim 13, wherein the detecting circuit detects the resistance of the magnetic sensor with a change of current flowing to the magnetic sensor.

16. An apparatus for inspecting a liquid crystal display, comprising:
    a first voltage source for supplying a first common voltage to one side of first signal wires;
    a second voltage source for supplying a second common voltage different from the first common voltage to one side of second signal wires;
    a magnetic sensor for scanning over at least one second signal wire stacked over at least one first signal wire, an insulation layer being located between the first signal wire and the second signal wires, and the magnetic sensor scans the first and second signal wires on pads connected to an other side of the first and second signal wires; and
    a detecting circuit for detecting a resistance change of the magnetic sensor to perceive an interlayer short in the signal wires.

17. The apparatus according to claim 16, wherein the magnetic sensor comprises one of a giant magneto-resistance sensor, a magneto-resistance sensor, a tunneling magneto-resistance sensor, a fluxgate sensor or an inductive sensor.

18. The apparatus according to claim 16, wherein the detecting circuit detects the resistance of the magnetic sensor with a change of current flowing to the magnetic sensor.

19. An apparatus for inspecting a liquid crystal display, comprising:
 a magnetic sensor including at least one magnetic sensor below a pixel in size for scanning over an electrode pattern; and
 a detecting circuit for detecting a resistance change of each of the magnetic sensors to perceive defects in the electrode pattern.

20. The apparatus according to claim 19, wherein the magnetic sensors comprises one of a giant magneto-resistance sensor, a magneto-resistance sensor, a tunneling magneto-resistance sensor, a fluxgate sensor or an inductive sensor.

21. The apparatus according to claim 19, wherein the detecting circuit detects the resistance of each of the magnetic sensors with a change of the current flowing to each of the magnetic sensors.

22. The apparatus according to claim 19, further comprising a voltage source for supplying a current to the electrode pattern.

* * * * *